(12) United States Patent
Yang

(10) Patent No.: US 6,617,248 B1
(45) Date of Patent: Sep. 9, 2003

(54) METHOD FOR FORMING A RUTHENIUM METAL LAYER

(75) Inventor: Sam Yang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/710,626

(22) Filed: Nov. 10, 2000

(51) Int. Cl.$^7$ ................................................ H01L 21/44
(52) U.S. Cl. .................... 438/686; 438/239; 438/243; 438/253; 438/386; 438/396; 438/660; 438/650
(58) Field of Search ................................ 438/686, 650, 438/239, 241, 243, 250, 253, 254, 240, 386, 387, 393, 396, 660, 663

(56) References Cited

U.S. PATENT DOCUMENTS

| | | | |
|---|---|---|---|
| 5,852,307 A | 12/1998 | Aoyama et al. | ............ 257/295 |
| 6,037,206 A | 3/2000 | Huang et al. | ................ 438/240 |
| 6,278,152 B1 | 8/2001 | Hieda et al. | ................. 257/306 |
| 6,284,587 B1 * | 9/2001 | Yamauchi et al. | ........... 438/240 |
| 2001/0043453 A1 * | 11/2001 | Narwankar et al. | ...... 361/306.3 |
| 2002/0037630 A1 * | 3/2002 | Agarwal et al. | ............. 438/430 |

OTHER PUBLICATIONS

"In–situ Barrier Formation for High Reliable W/Barrier/ poly–Si Gate Using Denudation of $WN_x$ on Polycrystalline Si", Byung Hak Lee et al., R & D Division, LG Semicon Co. Ltd., 1 Hyangjeong–dong, Cheongju–si, 361–480, Korea, 9/98.

"Tungsten Gate Structure Formed by Reduced Temperature Conversion of Tungsten Nitride", C. J. Galewski et al., Genus Inc.

Copending Application: "Methods for Forming and Integrated Circuit Structures Containing Ruthenium and Tungsten Containing Layers," Vishnu K. Agarwal, et al., Ser. No. 09/590,795, filed Jun. 8, 2000.

* cited by examiner

Primary Examiner—Wael Fahmy
Assistant Examiner—Thanhha Pham
(74) Attorney, Agent, or Firm—Kevin D. Martin

(57) ABSTRACT

A method for forming a ruthenium metal layer comprises combining a ruthenium precursor with a measured amount of oxygen to form a ruthenium oxide layer. The ruthenium oxide is annealed in the presence of a hydrogen-rich gas to react the oxygen in the ruthenium oxide with hydrogen, which results in a ruthenium metal layer. By varying the oxygen flow rate during the formation of ruthenium oxide, a ruthenium metal layer having various degrees of smooth and rough textures can be formed.

14 Claims, 4 Drawing Sheets

METHOD FOR FORMING A RUTHENIUM METAL LAYER

FIELD OF THE INVENTION

This invention relates to the field of semiconductor assembly, and more particularly to a method for forming layer of ruthenium metal.

BACKGROUND OF THE INVENTION

During the manufacture of semiconductor devices such as dynamic random access memories (DRAMs), microprocessors, and logic devices, several conductive structures are commonly formed. For example, transistor gates and capacitor bottom (storage) and top plates, typically manufactured from doped polysilicon, and interconnects and runners, typically formed from aluminum and/or copper, are formed on various types of devices.

A conductive material which has been used for various semiconductor device structures such as capacitor plates in ferroelectric devices is ruthenium oxide ($RuO_2$). Ruthenium oxide exhibits good step coverage and a uniform thickness across various topographies. However, $RuO_2$ is not stable and is a strong oxidizer. It will, over time, oxidize various metal layers that are in close proximity. For example, if $RuO_2$ is used as a capacitor bottom plate, it will oxidize a titanium nitride or tungsten nitride top plate through a tantalum pentoxide ($Ta_2O_5$) capacitor dielectric. Further, a barrier layer must be formed to protect a polysilicon contact pad from the $RuO_2$, as the $RuO_2$ will oxidize the polysilicon and result in a bottom plate being electrically isolated from the contact pad by a silicon dioxide layer.

Attempts have also been made to use ruthenium metal as capacitor plates or as various other structures, as ruthenium metal is stable and is easily planarized during chemical mechanical polishing (CMP). However, methods for forming a ruthenium metal layer, for example using chemical vapor deposition (CVD), result in a layer which has poor step coverage and has a rough surface. Ruthenium metal is formed excessively thin over features with excessive slope changes, and it does not adequately form in narrow areas such as deep digit line contact openings in a manner adequate to maintain its conductive integrity.

A method for forming a uniform ruthenium metal layer across severe topographies and which forms within deep, narrow openings would be desirable.

SUMMARY OF THE INVENTION

The present invention provides a new method that reduces problems associated with the manufacture of semiconductor devices, particularly problems in forming a ruthenium metal layer. In accordance with one embodiment of the invention a ruthenium precursor and oxygen are introduced into a chamber to form a ruthenium oxide layer. Next, the ruthenium oxide layer is heated in the presence of a hydrogen-rich gas to convert the ruthenium oxide layer to a ruthenium metal layer.

As will be discussed, the uniformity of the completed ruthenium metal layer is significantly dependent on the flow rate of oxygen introduced with the ruthenium precursor. As the flow rate of oxygen is increased from a minimum to form the ruthenium oxide layer, the uniformity of the completed ruthenium metal layer increases. As the oxygen flow rate increases past a critical point, however, the uniformity of the completed ruthenium metal layer begins to deteriorate.

While it is believed that a uniform ruthenium metal layer formed in accordance with various described embodiments is most desirable, a less than uniform ruthenium metal layer formed in accordance with the descriptions herein may also have utility.

Objects and advantages will become apparent to those skilled in the art from the following detailed description read in conjunction with the appended claims and the drawings attached hereto.

Figure 1:
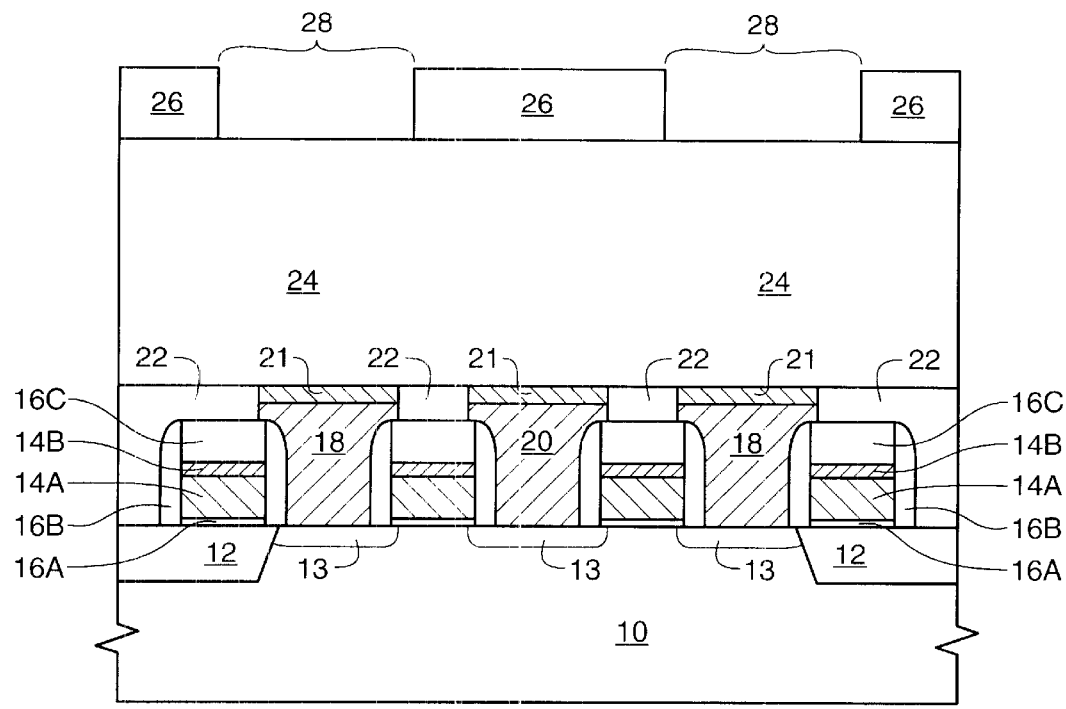
FIG. 1 is a cross section depicting a wafer substrate assembly in one exemplary use of the method described herein.

It should be emphasized that the drawings herein may not be to exact scale and are schematic representations. The drawings are not intended to portray the specific parameters, materials, particular uses, or the structural details of the invention, which can be determined by one of skill in the art by examination of the information herein.

DETAILED DESCRIPTION OF THE PREFERRED EMBODIMENT

Various embodiments of the inventive method comprise forming a ruthenium oxide layer, then converting the ruthenium oxide layer to ruthenium metal. To form the ruthenium oxide layer, a ruthenium precursor and an oxygen source are introduced into a chamber such as an Applied Materials 5000 chemical vapor deposition (CVD) tool. It should be noted that the values specified herein are calibrated for an Applied Materials 5000, but they may be modified for other chambers if necessary.

The oxygen source, such as $O_2$ gas, is preferably pumped into the chamber at a flow rate of between about 10 standard $cm^3$ (sccm) and about 1000 sccm, more preferably at a flow rate of between about 150 sccm and about 250 sccm, and most preferably at about 200 sccm.

The ruthenium precursor may include a number of materials, including tricarbonyl-1,3-cyclohexadiene ruthenium (referred to herein as "CHDR"), bisethylcyclopentadienylruthenium (Ru($C_2 H_5C_5H_4$)$_2$, referred to herein as "Ru(EtCp)$_2$"), and ruthenium octanedionate (referred to herein as "Ru(OD)$_3$"). The ruthenium precursor is preferably pumped into the chamber at a flow rate of between about 10 sccm to about 2000 sccm, more preferably at a flow rate of between about 100 and about 1000 sccm, and most preferably at a flow rate of about 500 sccm.

The chamber further comprises an environment having a pressure preferably between about 0.1 Torr to about 90 Torr, and more preferably at a pressure of between about 1.0 Torr and about 9.0 Torr. A chamber temperature of between about 100° C. and about 600° C., more preferably between about 150° C. and about 450° C., and most preferably about 210° C. would be sufficient. At the preferred parameters the ruthenium oxide forms at a rate of about 200 Å/minute.

The oxygen source gas flow rate was found during testing to significantly affect the quality of the completed ruthenium metal layer. When the flow rate of $O_2$ was around 200 sccm during the above-described formation of RuO$_2$, for example between about 150 sccm and 250 sccm, the completed ruthenium metal layer was relatively uniform and had minimal pinholing. At an $O_2$ flow rate above or below about 200 sccm, especially at flow rates less than about 200 sccm, the completed ruthenium metal layer was subject to an increasing number of pinholes and an increasingly rough surface the further the flow rate varied from about 200 sccm. While a smooth ruthenium metal layer will be desirable in most uses, a rough layer may also be useful, for example to form a layer having an increased surface area.

Using the gas and precursor flow rates, temperature, and pressure indicated, the ruthenium oxide forms at a rate of about 200 Å/minute. The material which forms is believed to be a mixture of Ru and RuO$_2$, however it is expected that RuO$_x$ where "x" is other than 2 will also form in various ratios. RuO$_2$ content in the film increases as the $O_2$ flow rate increases.

Next, the ruthenium oxide layer is heated or annealed in the presence of a hydrogen-rich gas to form the ruthenium metal layer. The hydrogen-rich gas reacts with the oxygen from the ruthenium oxide layer, leaving a layer of ruthenium metal. Sufficient hydrogen-rich gasses include ammonia (NH$_3$) and hydrogen gas (H$_2$), preferably at a flow rate of between about 100 sccm and about 10,000 sccm, more preferably between about 500 sccm and about 8,000 sccm, and most preferably between about 3,000 sccm and about 6,000 sccm. The chamber further comprises an environment having a pressure preferably between about 1 Torr to about 760 Torr, and more preferably at a pressure of between about 100 Torr and about 660 Torr. A chamber temperature of between about 400° C. and about 800° C., more preferably between about 450° C. and about 750° C., and most preferably between about 475° C. and about 650° C. would be sufficient. For generally any thickness of RuO$_2$, an annealing duration of between about 10 seconds and about 5 minutes will be sufficient, and a duration of between about 30 seconds and about 3 minutes, for example 60 seconds, will be sufficient for most thicknesses.

Upon completion of the anneal step, the resulting ruthenium metal layer will have a thickness of from about 50% to about 80% of the thickness of the ruthenium oxide layer before annealing.

FIGS. 1–5 depict an exemplary use of a ruthenium metal layer as a capacitor bottom plate formed in one inventive embodiment of the invention. FIG. 1 depicts a semiconductor wafer substrate assembly comprising a semiconductor wafer 10, field oxide 12, doped wafer areas 13, transistor control gates typically comprising a polysilicon gate 14A and silicide 14B, and surrounding dielectric typically comprising gate oxide 16A, nitride spacers 16B, and capping layer 16C, for example tetraethyl orthosilicate (TEOS). The device further comprises polysilicon contact pads including pads 18 to which the ruthenium metal container capacitor bottom plate will be electrically coupled and pads 20 (only one depicted) which will form a portion of a digit line contact to the wafer 10. FIGS. 1–5 further depict a conductive barrier layer 21 such as tungsten nitride (WN$_x$), TiN, TaN, TaSiN, TiSiN, and tungsten, or a stack of more than one of these layers. A dielectric layer 22, for example borophosphosilicate glass (BPSG), separates the pads.

The polysilicon layer which forms pads 18, 20 is recessed within layer 22 before formation of barrier layer 21, layer 21 is formed, then layer 21 can be removed from over oxide layer 22 using chemical mechanical polishing (CMP). A barrier layer between about 50 Å and about 1,000 Å thick would be sufficient. Also depicted is a second layer of dielectric 24 which can be one or more layers of TEOS and/or BPSG. With current technology, layer 24 can be about 14,000 Å thick. A layer of photoresist 26 defines openings 28 which overlie pads 18 to which the container capacitors will be electrically coupled. The structure of FIG. 1 is exposed to a vertical anisotropic etch which removes the dielectric layer 24 selective to the polysilicon contact pads 18.

Figure 2:
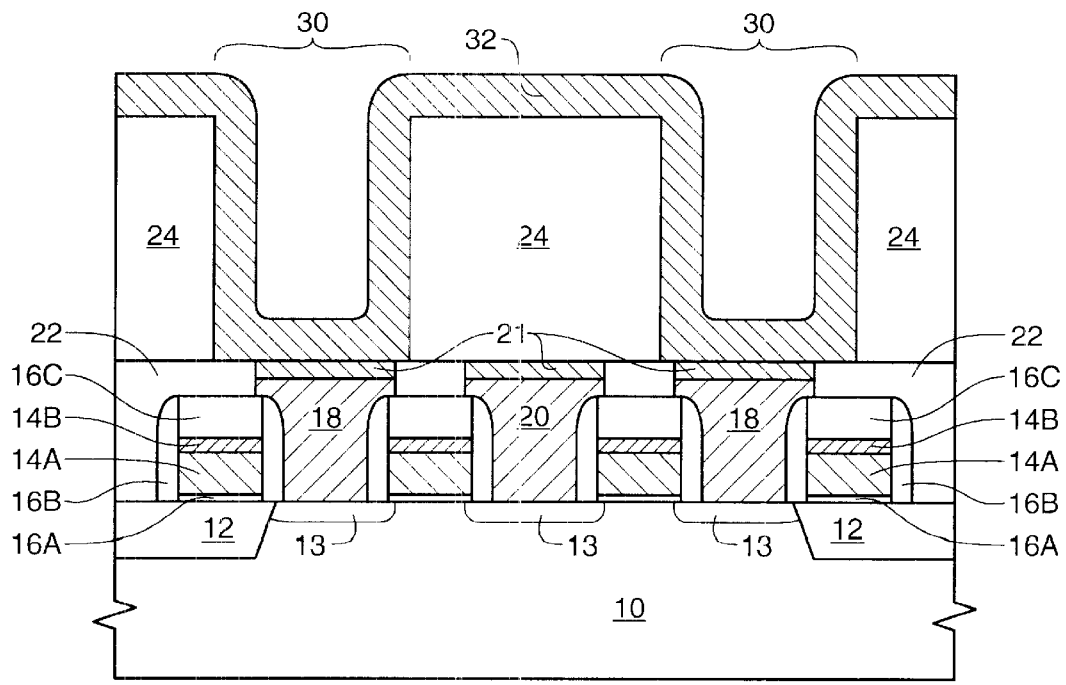
FIG. 2 depicts the FIG. 1 structure subsequent to a dielectric etch and the formation of a ruthenium oxide layer.

FIG. 2 depicts openings 30 in dielectric 24 which result from the etch of the FIG. 1 structure. The etch exposes barrier layer 21, which is electrically coupled with pads 18, 20, and the pads 18,20 contact the doped regions 13. Pads 18 decrease the amount of oxide which the etch of the FIG. 1 structure must remove. Without pads 18, the etch would be required to remove the additional thickness of oxide layer 22 to expose doped regions 13.

After forming the openings, a blanket layer of ruthenium oxide (RuO$_2$) 32, is formed over exposed surfaces including barrier layer 21. The barrier layer prevents oxidation of the polysilicon pads 18 by the RuO$_2$ layer. A RuO$_2$ layer between about 300 angstroms (Å) thick and about 400 Å thick would be sufficient for this exemplary embodiment. Such as layer can be formed by providing a CHDR precursor at a flow rate of about 500 sccm and an $O_2$ flow rate of about 200 sccm in a chamber having a temperature of about 210° C. and a pressure of from about 1 Torr to about 9 Torr for about 2 minutes.

Figure 3:
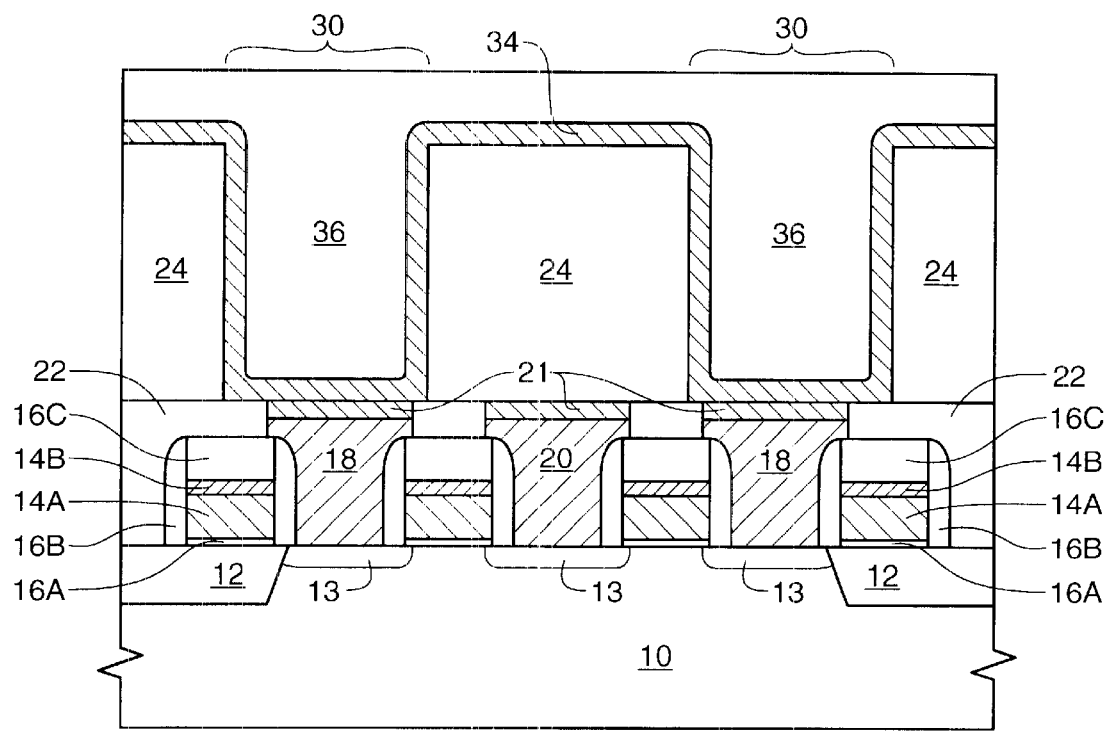
FIG. 3 depicts the FIG. 2 structure subsequent to annealing the ruthenium oxide layer to form a ruthenium metal layer, and after forming a protective layer over the ruthenium metal layer.

Next, the RuO$_2$ 32 is converted to ruthenium metal 34 as depicted in FIG. 3. This can be completed in situ in the chamber or in a different chamber by providing a hydrogen gas (H$_2$) or ammonia (NH$_3$) flow rate of between about 500 sccm and 5,000 sccm, at a temperature of between about 475° C. and about 750° C. at a pressure of between about 5 Torr to about 660 Torr for a duration of between about one minute and about three minutes. This results in a ruthenium metal layer bottom plate layer 34 between about 150 Å and about 250 Å thick.

Figure 4:
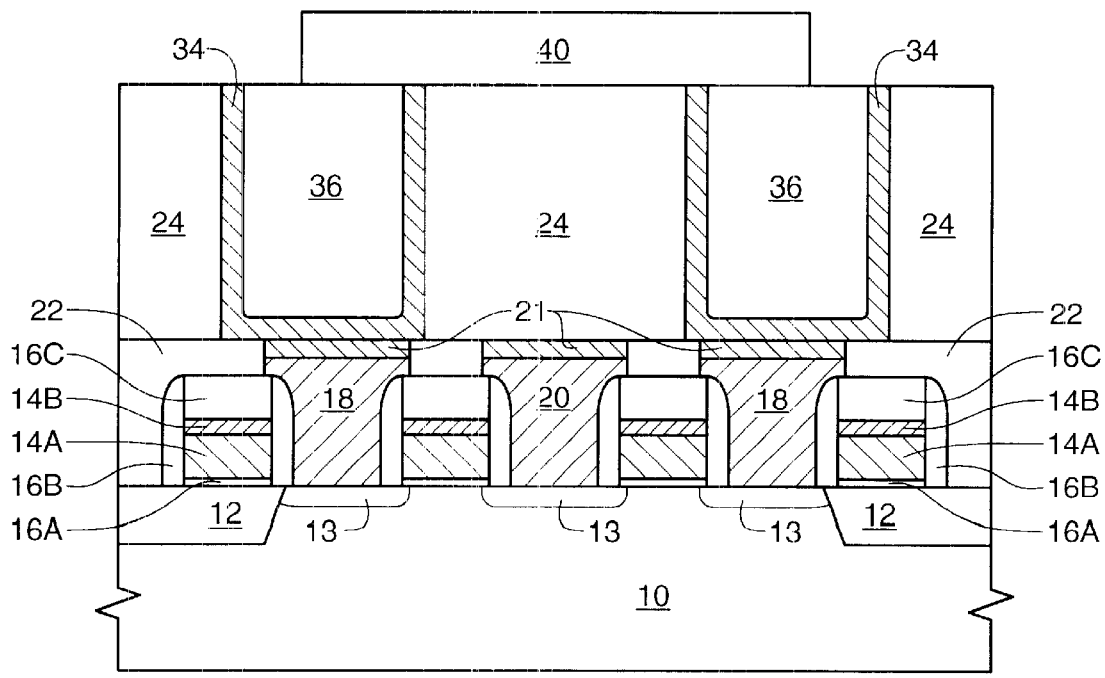
FIG. 4 depicts the FIG. 3 structure subsequent to performing an etch of the ruthenium metal layer and after forming a mask layer over the wafer substrate assembly surface.
Figure 5:
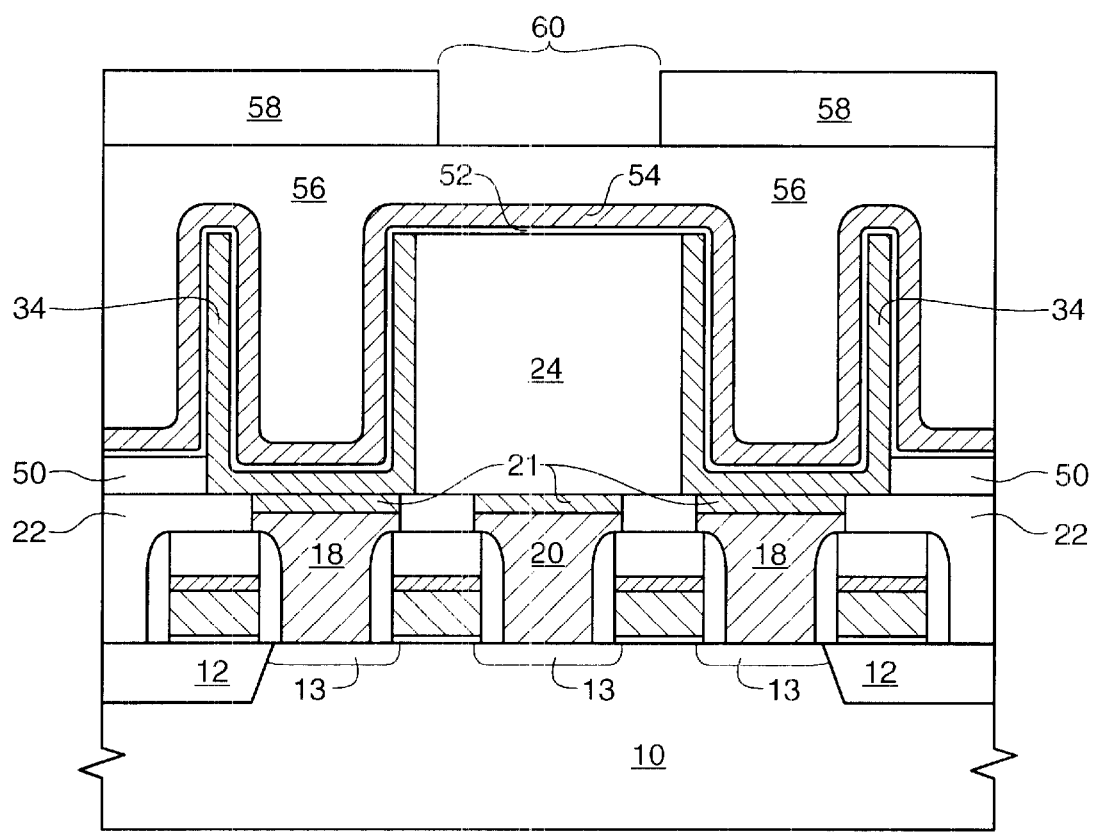
FIG. 5 depicts the FIG. 4 structure subsequent to forming a cell dielectric layer, a capacitor top plate layer, a planar dielectric layer, and a mask layer to define an opening to a digit line contact pad.

Subsequently, the openings 30 are filled with a sacrificial protective material 36 such as photoresist and the ruthenium metal and a portion of dielectric 24 are etched, for example using CMP. This removes the ruthenium metal from the horizontal surface of dielectric 24 to result in the ruthenium metal capacitor bottom plate structures 34 of FIG. 4. A photoresist mask 40 is formed over the structure to protect the oxide layer between the two container capacitors depicted, then an oxide etch is completed to remove a portion of the exposed oxide depicted as 50 in FIG. 5. Next, the photoresist layers 36, 40 of FIG. 4 are removed and a blanket cell dielectric layer such as silicon nitride 52 (cell nitride), $Ta_2O_5$, $Al_2O_3$, $HfO_2$,$ZrO_2$, barium strontium titanate (BST), hafnium silicate ($HfO_2.SiO_2$) or zirconium silicate ($ZrO_2.SiO_2$) is formed. Next, a capacitor top plate 54 is formed, for example from TiN, tungsten nitride (or a $WN_x$ layer), Pt, Ru, W, Pt-Rh, Ta, TaN, $RuO_2$, etc. A planar layer of BPSG 56, which with current technology has a thickness of about 4,000 Å, is formed and a patterned photoresist layer 58 is formed which defines an opening 60 which will expose digit line contact pad 20. Wafer processing continues according to means know in the art to form a semiconductor memory device.

The exemplary embodiment described above will provide a smooth capacitor ruthenium metal bottom plate layer. It may be desirable to provide a rough bottom plate layer to increase the surface area and therefore the capacitance between the bottom and top plates. Such a layer can be formed according to the description above, except that an $O_2$ flow rate of between about 10 sccm and about 100 sccm is provided. This process will result in a rough ruthenium metal surface subsequent to annealing the $RuO_2$ layer. However, a conductive bottom layer such as $WN_x$ or TaN may be necessary under the ruthenium metal layer to ensure complete electrical conduction across the layer with minimal resistance. This may be required because at the lower $O_2$ flow rates required to form the textured ruthenium metal layer after annealing, $RuO_2$ step coverage and coverage across vertical or near vertical surfaces may not be adequate to form a blanket layer which is free from pinholing and may even form regions of isolated ruthenium metal.

Figure 6:
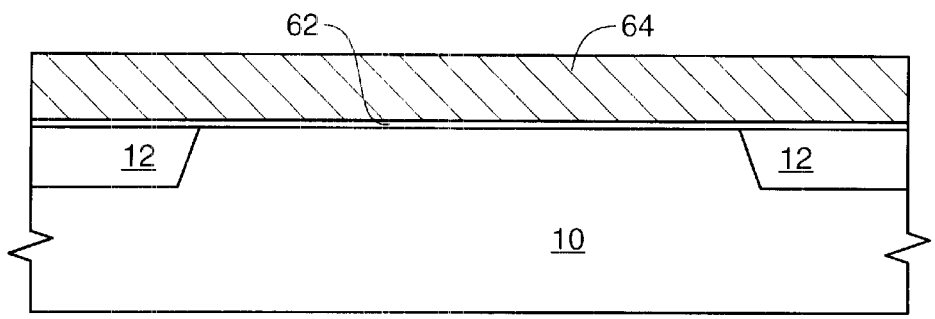
FIG. 6 is a cross section depicting another exemplary embodiment of the invention to form a transistor control gate.

FIGS. 6–9 depict an embodiment of the invention for use as a control gate layer. FIG. 6 depicts a semiconductor wafer 10 having regions of field oxide 12 formed therein. FIG. 6 further depicts blanket gate oxide layer 62, for example about 60 Å thick, formed thereover. The gate oxide may comprise any number of materials, including $SiO_2$, $SiO_xN_y$ (oxynitride), $HfO_2$, $ZrO_2$, $TiO_2$, $Ta_2O_5$, hafnium silicate ($HfO_2.SiO_2$), or zirconium silicate ($ZrO_2.SiO_2$) formed according to means known in the art. After forming the gate oxide layer, a blanket layer of $RuO_2$ 64, for example between about 200 Å and about 1,000 Å thick, is formed thereover. Such a layer can be formed by providing a CHDR precursor at a flow rate of about 500 sccm and an $O_2$ flow rate of about 200 sccm in a chamber having a temperature of about 210° C. and a pressure of from about 1 Torr to about 9 Torr for between about one minute and about five minutes based on a formation rate of about 200 Å/min.

Figure 7:
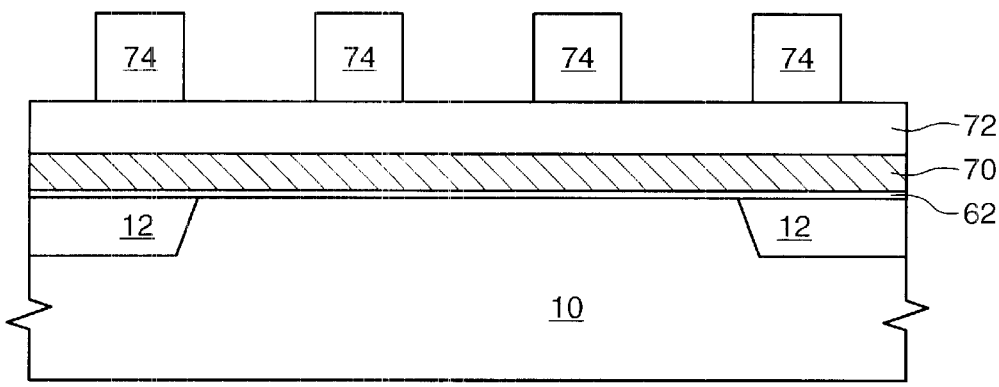
FIG. 7 depicts the FIG. 6 structure after converting ruthenium oxide to ruthenium metal, and after the formation of a gate capping layer and a patterned photoresist layer.

Next, the $RuO_2$ 64 is converted to ruthenium metal 70 as depicted in FIG. 7. This can be completed in a chamber by providing a hydrogen gas ($H_2$) or ammonia gas ($NH_3$) flow rate of between about 500 sccm and about 5,000 sccm, at a temperature of between about 475° C. and about 750° C. at a pressure of about 5 Torr to about 660 Torr for a duration of between about one minute and about three minutes. These process parameters result in a ruthenium metal layer 70 between about 150 Å to about 800 Å thick.

Figure 8:
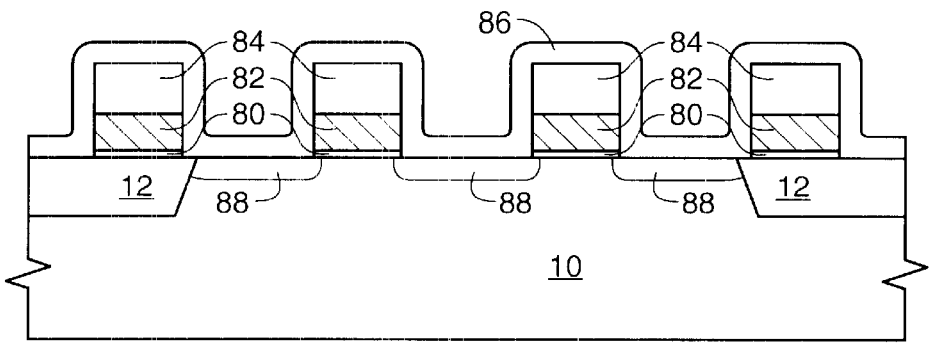
FIG. 8 depicts the FIG. 7 structure after etching the capping layer, the ruthenium metal layer, and the gate oxide layer, and after forming a spacer layer.

Subsequently, a planar gate capping layer 72 about 2,500 Å thick is formed over the ruthenium layer. This capping layer can be a planar layer of silicon nitride between about 100 Å and about 500 Å thick, and can also comprise a thin TEOS layer interposed between the ruthenium metal control gate and the nitride capping layer. After completing the nitride capping layer, a patterned photoresist layer 74 is formed. The structure of FIG. 7 is etched using an anisotropic etch which defines the transistor gate stack including gate oxide 80, ruthenium metal control gate 82, and nitride capping layer 84 as depicted in FIG. 8. The ruthenium metal layer can be etched using $O_2$ or $O_3$ with a biased plasma in a dry etch chamber.

After etching the FIG. 7 structure to result in the gate stack of FIG. 8, any necessary wafer implantation, for example using arsenic, phosphorous, or boron, is performed to alter the electrical characteristics of the wafer and to form doped regions 88 according to means known in the art. Next, a conformal blanket spacer layer 86, such as a silicon nitride layer, is formed over exposed surfaces. A $Si_3N_4$ layer between about 400 Å and about 1,000 Å thick, formed according to means known in the art, would be sufficient.

Figure 9:
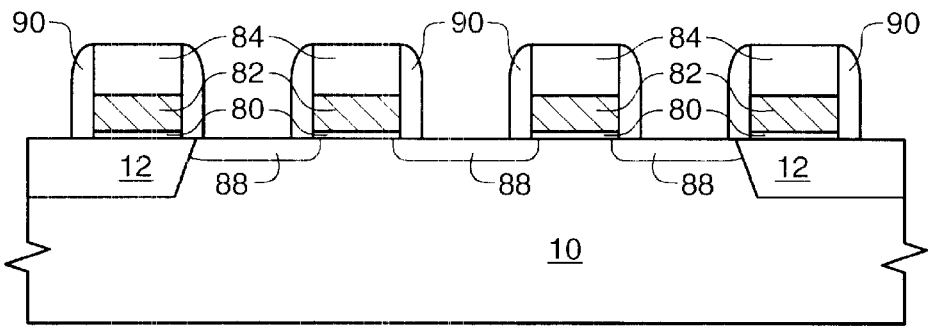
FIG. 9 depicts the FIG. 8 structure after a spacer etch.

Finally, the spacer layer is etched to form spacers 90 as depicted in FIG. 9. Wafer processing continues according to means known in the art to form a functional semiconductor device.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

What is claimed is:

1. A method used during the formation of a semiconductor device comprising:

providing a semiconductor substrate assembly;

providing a ruthenium precursor and oxygen in a chamber to form a ruthenium oxide layer over said semiconductor substrate assembly;

heating said ruthenium oxide layer in the presence of a hydrogen-rich gas to form a smooth-surfaced ruthenium metal layer which defines a portion of a semiconductor device capacitor;

forming a patterned photoresist layer over said ruthenium metal layer; and etching said smooth-surfaced ruthenium metal layer using said photoresist layer as a pattern to define a semiconductor device portion.

2. A method used during the formation of a semiconductor device to form a plurality of storage capacitors, comprising:

providing a semiconductor substrate assembly comprising a semiconductor wafer and a plurality of transistor control gates formed over said semiconductor wafer;

forming a plurality of contact pads electrically coupled with said semiconductor wafer;

forming a dielectric layer overlying said contact pads;

forming a patterned photoresist layer to define openings which overlie said contact pads;

etching said dielectric layer to form cross-sectional sidewalls in said dielectric layer and to expose said contact pads;

with said semiconductor wafer in a chamber, providing a ruthenium precursor at a flow rate of between about 100 sccm and 1000 sccm and $O_2$ at a flow rate of between about 10 sccm and 1000 sccm in a chamber environment comprising a temperature of between about 100° C. and about 600° C. and a pressure of from about 1 Torr to about 9 Torr for about 2 minutes to form a conformal blanket ruthenium oxide layer which contacts said sidewalls in said dielectric layer and contacts said contact pads;

subsequent to forming said ruthenium oxide layer, providing at least one of hydrogen gas and ammonia in said chamber at a flow rate of between about 500 sccm and 5000 sccm at a temperature of between about 475° C. and about 750° C. and at a pressure of between about 5 Torr and about 660 Torr for a duration of between about 1 minute and about 3 minutes to convert said ruthenium oxide layer to a ruthenium metal layer;

subsequent to converting said ruthenium oxide layer to a ruthenium metal layer, forming a sacrificial protective material within recesses defined by said ruthenium metal layer;

subsequent to forming said sacrificial protective material, removing said ruthenium metal layer from horizontal surfaces of said dielectric layer;

subsequent to removing said ruthenium metal layer from said horizontal surfaces of said dielectric layer, removing said protective material from said recesses defined by said ruthenium metal layer to expose said ruthenium metal layer;

forming a capacitor dielectric layer over said ruthenium metal layer; and forming a capacitor top plate over said ruthenium metal layer.

3. The method of claim 2 further comprising:

forming a polysilicon silicon layer over said semiconductor substrate assembly;

removing a portion of said polysilicon layer to form a first portion of said plurality of contact pads;

forming a barrier layer over said polysilicon layer to form a second portion of said plurality of contact pads; and during said etch of said dielectric layer, exposing said barrier layer thereby exposing said contact pads.

4. The method of claim 3 wherein said formation of said barrier layer further comprises forming at least one of a material selected from the group consisting of tungsten nitride, titanium nitride, tantalum nitride, tantalum silicon nitride, titanium silicon nitride, and tungsten.

5. The method of claim 2 wherein said formation of said ruthenium oxide layer further comprises providing a tricarbonyl-1,3-cyclohexadiene ruthenium ruthenium precursor.

6. The method of claim 5 wherein said formation of said ruthenium oxide layer further comprises providing said tricarbonyl-1,3-cyclohexadiene ruthenium ruthenium precursor at a flow rate of about 500 sccm and providing said $O_2$ at a flow rate of about 200 sccm at a temperature of about 210° C.

7. The method of claim 2 wherein said formation of said ruthenium oxide layer further comprises providing a bisethylcyclopentadienylruthenium ruthenium precursor.

8. The method of claim 2 wherein said formation of said ruthenium oxide layer further comprises providing a ruthenium octanedionate ruthenium precursor.

9. The method of claim 2 wherein said formation of said ruthenium oxide layer further comprises providing a ruthenium octanedionate ruthenium precursor.

10. A method used to form a semiconductor device comprising:

providing a semiconductor wafer assembly comprising a semiconductor wafer;

placing said wafer assembly into a chamber;

with said semiconductor wafer in a chamber, providing a ruthenium precursor at a flow rate of between about 100 and 1000 sccm and providing $O_2$ at a flow rate of between about 10 to about 100 sccm in a chamber environment comprising a temperature of between about 150° C. and about 450° C. and a pressure of from about 1 Torr to about 9 Torr for about 2 minutes to form a conformal blanket ruthenium oxide layer which contacts said semiconductor wafer substrate assembly; and subsequent to forming said ruthenium oxide layer, providing at least one of hydrogen gas and ammonia in said chamber at a flow rate of between about 500 sccm and 5000 sccm at a temperature of between about 475° C. and about 750° C. and at a pressure of between about 5 Torr and about 660 Torr for a duration of between about 1 minute and about 3 minutes to convert said ruthenium oxide layer to a ruthenium metal layer.

11. The method of claim 10 further comprising:

forming a conductive contact pad which electrically contacts said semiconductor wafer prior to forming said ruthenium oxide layer; and forming said ruthenium oxide layer to contact said conductive contact pad.

12. The method of claim 11 wherein said formation of said ruthenium metal layer further comprises forming regions of isolated ruthenium metal, wherein said regions of isolated ruthenium metal are electrically coupled by said conductive contact pad.

13. The method of claim 10 wherein said formation of said ruthenium oxide layer further comprises providing a tricarbonyl-1,3-cyclohexadiene ruthenium ruthenium precursor.

14. The method of claim 10 wherein said formation of said ruthenium oxide layer further comprises providing a bisethylcyclopentadienylruthenium ruthenium precursor.

* * * * *